United States Patent [19]

Leifsen, Jr.

[11] Patent Number: 4,841,904

[45] Date of Patent: Jun. 27, 1989

[54] FASTENER AIR BRUSH

[75] Inventor: J. Arthur Leifsen, Jr., Bethpage, N.Y.

[73] Assignee: Grumman Aerospace Corporation, Bethpage, N.Y.

[21] Appl. No.: 151,314

[22] Filed: Feb. 1, 1988

[51] Int. Cl.$^4$ .......................... C23C 14/00; B05B 5/02; B05C 5/02

[52] U.S. Cl. .................................... 118/50; 118/50.1; 118/629; 118/326; 239/693; 239/122; 141/20.5; 141/59

[58] Field of Search ........................... 401/143, 188 R; 239/105, 120, 121, 122, 693; 346/75, 140 R; 141/20.5, 59, 65; 118/50, 50.1, 305, 326, 629

[56] References Cited

U.S. PATENT DOCUMENTS

| | | | |
|---|---|---|---|
| 2,270,579 | 1/1942 | Chamberlin et al. | 239/105 X |
| 2,488,195 | 11/1949 | Ivey | 239/105 |
| 3,306,252 | 2/1967 | Knight et al. | 118/710 |
| 3,532,325 | 10/1970 | Barnett, Jr. | 118/50 |
| 3,867,969 | 2/1975 | Garnett | 141/59 |
| 3,893,620 | 7/1975 | Rokadia | 118/629 X |
| 3,900,866 | 8/1975 | Bell et al. | 346/140 R X |
| 3,943,527 | 3/1976 | Hartmann | 346/140 R X |
| 4,069,974 | 1/1978 | Zawacki | 239/120 X |
| 4,422,576 | 12/1983 | Saito et al. | 239/121 X |

FOREIGN PATENT DOCUMENTS

| | | | |
|---|---|---|---|
| 233700 | 10/1962 | Austria | 239/693 |

*Primary Examiner*—Richard J. Apley
*Assistant Examiner*—David J. Bender
*Attorney, Agent, or Firm*—Richard G. Geib; Daniel J. Tick; Bernard S. Hoffman

[57] ABSTRACT

A hand held device for coating a fastener with a coating and which includes a first body with a free end and which defines a first chamber that is placeable over the fastener, apparatus for supplying the coating under a pressure to the first chamber for coating the fastener with the coating, a second body with a free end and which is disposed external to the first body so as to form a second chamber therebetween, the second body is rigidly attached to the first body and the free end of the second body is displaced a distance below the free end of the first body so as to form a passageway therebetween, and apparatus for reducing pressure in the second chamber, the reducing apparatus draws the coating from the first chamber where the fastener is initially coated with the coating from the supply apparatus through the passageway and into the second chamber which causes the second chamber to fill with the coating so that when the pressure of the supply apparatus is eliminated the coating is drawn back from the second chamber through the passageway and into the first chamber where the fastener is recoated with the coating to assure that all areas of the fastener is coated with the coating.

22 Claims, 10 Drawing Sheets

FASTENER AIR BRUSH

BACKGROUND OF THE INVENTION

1. Field of the Invention

The present invention relates to a coating applicator. More particularly, the present invention relates to an air brush for applying a coating to a fastener.

2. Description of the Prior Art

A typical HI-LOCK type fastener is shown in FIG. 1, a rivet-like fastener. In order to prevent corrosion of the HI-LOCK fastener, it must be coated with a primar or primer and paint after it has been used to fasten materials together. A brush is used, as shown in FIG. 2, to apply the coating. However, this method is laborious, time consuming, provides non-uniform results, and does not assure that all of the surfaces of the fastener will be properly coated.

SUMMARY OF THE INVENION

Accordingly, it is an object of the present invention to provide a fastener air brush that avoids the disadvantages of the prior art.

More particularly, it is an object of the present invention to provide a fastener air brush that is simple and easy to use, is hand held, provides uniform results, assures complete coating of the fastener, and masks the area to be coated.

In keeping with these objects, and with others which will become apparent hereinafter, one feature of the present invention resides, briefly stated, in a hand held device for coating a fastener with a coating and which has a first body with a free end and which defines a first chamber that is placeable over the fastener, means for supplying the coating under a pressure to the first chamber for coating the fastener with the coating, a second body with a free end and which is disposed external to the first body so as to form a second chamber therebetween and which is rigidly attached to the first body and the free end of the second body is displaced a distance below the free end of the first body so as to form a passageway therebetween, wherein means for reducing pressure in the second chamber are provided and the reducing means draw the coating from the first chamber where the fastener is initially coated with the coating from the supply means through the passageway and into the second chamber which causes the second chamber to fill with the coating.

When the fastener air brush is designed in accordance with the present invention and when the pressure of the supply means is eliminated, the coating flows back from the second chamber through the passageway and into the first chamber where the fastener is recoated with the coating to assure that all areas of the fastener are coated with the coating.

In accordance with another feature of the present invention, the first body is a cylindrical tube.

Another feature of the present invention is that the supply means include compressor means.

Yet another features of the present invention is that the supply means further include an atomizer.

Still another feature of the present invention is that the supply means further include a meter.

Yet still another feature of the present invention is that the pressure reducing means include means for pulsating the pressure so that when the pressure of the supply means is eliminated, the flow of the coating will alternately accelerate and decelerate toward the fastener.

Still yet another feature of the present invention is that the second body is a cylindrical tube.

Another feature of the present invention is that the pressure reducing means are in fluid communication with the second chamber.

Yet another feature of the present invention is that the pressure reducing means further include an expansion tank.

Still another feature of the present invention is that the pressure reducing means include regulators and valves.

Yet still another feature of the present invention is that it further includes means for removing excess coating from the fastener.

Still yet another feature of the present invention is that the removing means include means for venting the pressure reducing means and the first chamber to atmospheric pressure so that the first chamber and the second chamber are evacuated by drawing atmosphere through the pressure reducing means, the second chamber, the first chamber, and out the first chamber.

Another feature of the present invention is that the venting means include a check valve and a vent.

Yet another feature of the present invention is that it further includes locating means for properly positioning the first body over the fastener.

Still another feature of the present invention is that the locating means are retractable.

Yet still another feature of the present invention is that it further includes a seal disposed on the free end of the second body so that the coating is prevented from coating unwanted areas.

Still yet another feature of the present invention is that the seal is rubber.

Another feature of the present invention is that it further includes means for attracting the coating to the fastener.

Yet another feature of the present invention is that the attracting means include electrostatic means.

Still another feature of the present invention is that the first tube is a positive electrode and the fastener is a negative electrode so that a d.c. voltage potential can exist between the first body and the fastener.

Yet still another feature of the present invention is that it further includes an insulator disposed on the internal side of the first body so that contact between the positive electrode and the negative electrode is prevented.

Finally, still a further feature of the present invention is that it further includes voltage regulators and electronic sensors so that potential arcing across the positive electrode and the negative electrode is guarded against.

The novel features which are considered characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF PREFERRED EMBODIMENTS

Figure 1:
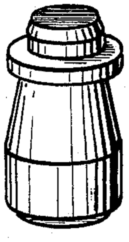
FIG. 1 is a perspective view of a HI-LOCK fastener.
Figure 2:
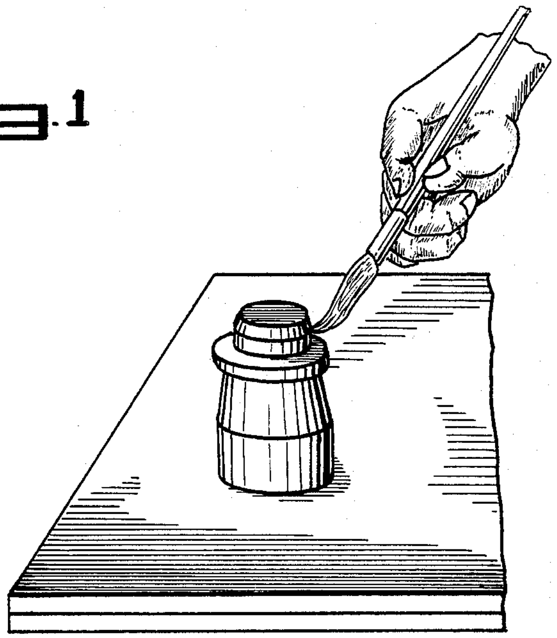
Fig. 2 (PRIOR ART)
FIG. 2 is a perspective view of prior art method of coating the HI-LOCK fastener of FIG. 1.
Figure 3:
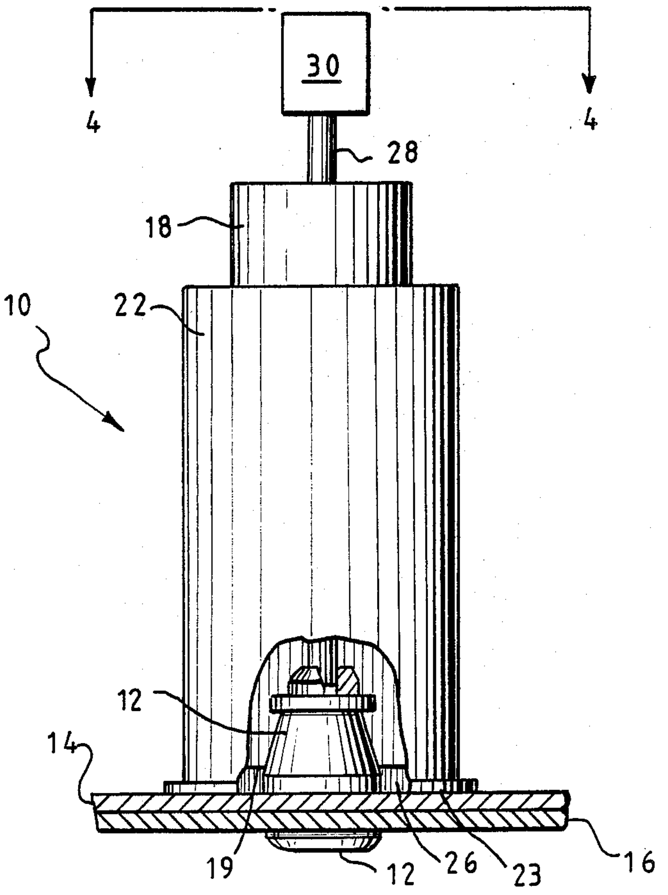
FIG. 3 is a side view in partial section of the fastener air brush of the present invention shown placed over the HI-LOCK fastener of FIG. 1 which is shown securing two pieces of material together.

Referring now to FIG. 3, the fastener air brush of the present invention is shown generally at 10, placed over a HI-LOCK fastener 12, or the like, which is securing together two pieces of material 14 and 16.

Figure 4:
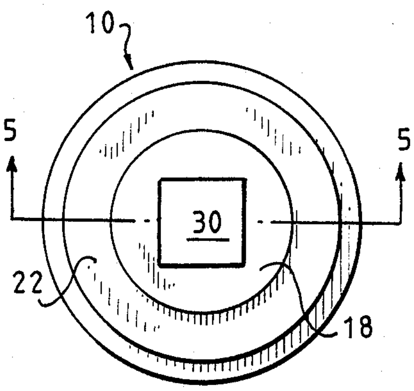
FIG. 4 is a top view taken along line 4—4 of FIGURE 3 and showing the concentricity of parts.
Figure 5:
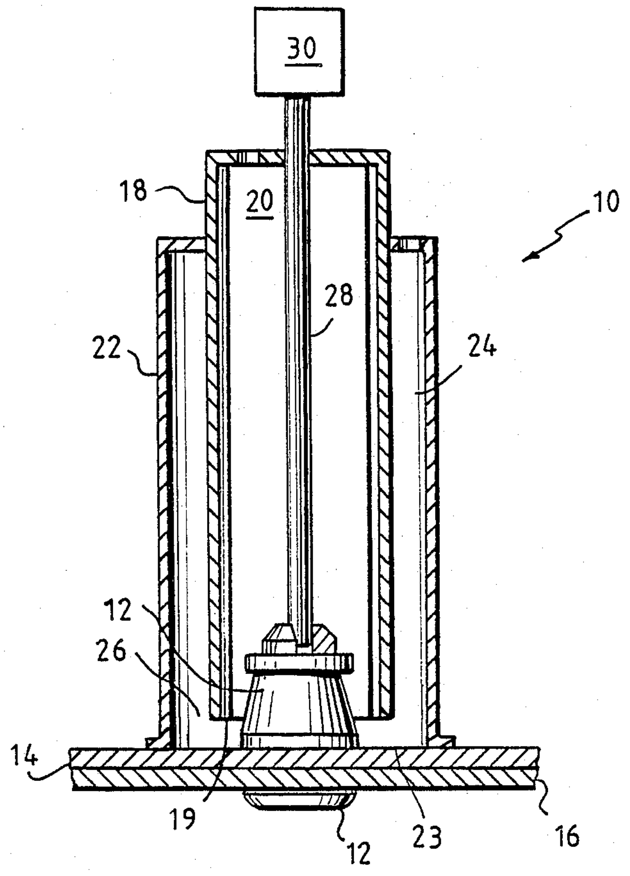
FIG. 5 is a sectional view taken along line 5—5 of FIG. 4 and showing the placement of parts.

As shown in FIGS. 3 to 5, the fastener air brush 10 has a first body 18 with a free end 19. The first body 18 which can be cylindrical, but is not limited to it, contains a first or primary chamber 20. The fastener air brush 10 has a second body 22 which can be cylindrical, but is not limited to it, with a free end 23. The second body 22 is disposed external to the first body 18. A second or secondary chamber 24 is formed between the first body 18 and the second body 22. The first body 18 is rigidly attached to the second body 22 and the free end 23 of the second body 22 is displaced a distance below the free end 19 of the first body 18. A passagewauy 26 is formed between the free end 23 of the second body 22 and the free end 19 of the first body 18. A retractable locator pin 28 is disposed centrally to the first body 18 and removably mates with the HI-LOCK fastener 12 to assure proper positioning of the fastener air brush 10. Retractor means 30, which is conventional in the art such as mechanical action or the like, provides for raising and lowering of the locator pin 28.

Figure 6:
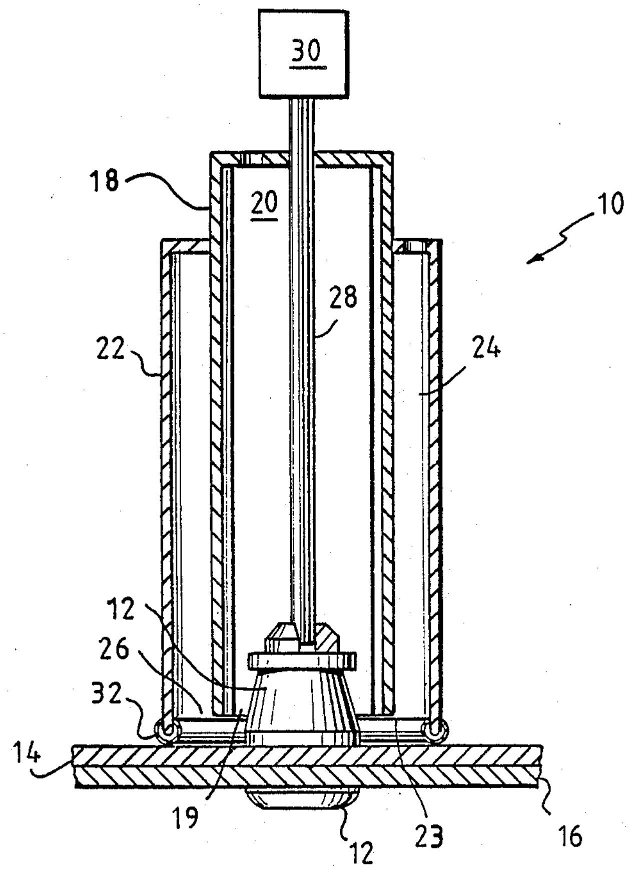
FIG. 6 is a sectional view showing a seal disposed on the free end of the second body so that the HI-LOCK fastener shown in FIG. 1 is masked and the coating does not settle on any unwanted areas.

As shown in FIG. 6, in order to assure that the coating does not settle on any unwanted areas, a seal 32 is provided on the free end 23 of the second body 22 so as to confine the coating to the area within the confines of the fastener air brush 10. The seal 32 is preferably rubber, but is not limited to it.

Figure 7:
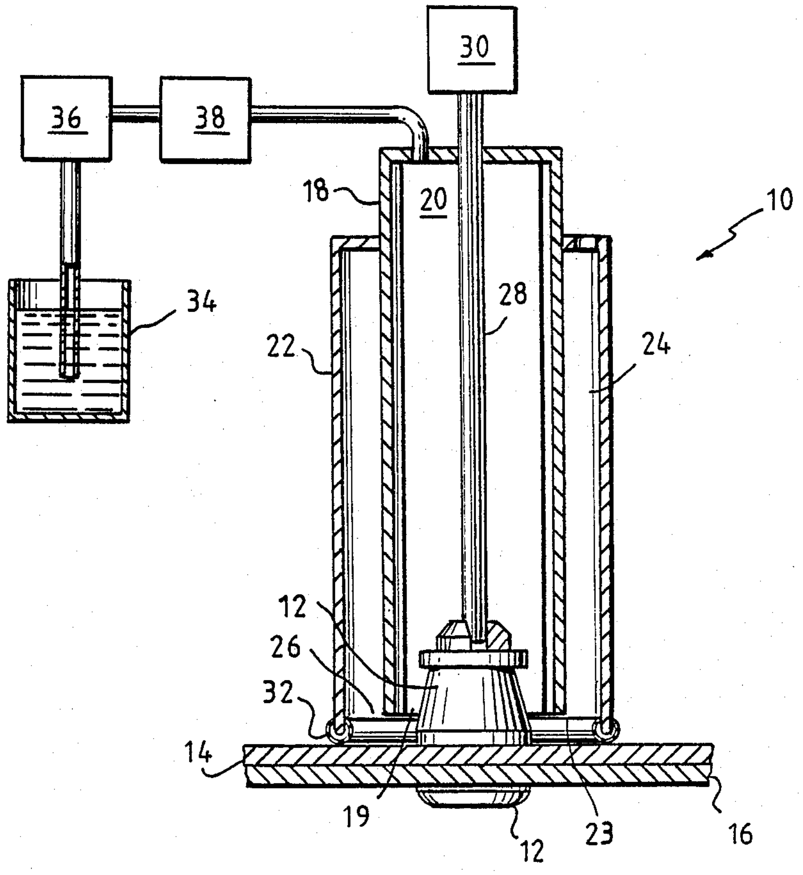
FIG. 7 is a sectional view showing the primary side of the present invention as applied to FIG. 6.

The primary side of the fastener air brush 10 is shown in FIG. 7. A coating supply 34, such as primer or the like, but is not limited to it, is subjected to atomizer means 36 and pressurizing means 38 so that the coating 34 enters the primary chamber 20 in mist form and under controlled pressure (i.e. the coating is metered into the primary chamber).

Figure 8:
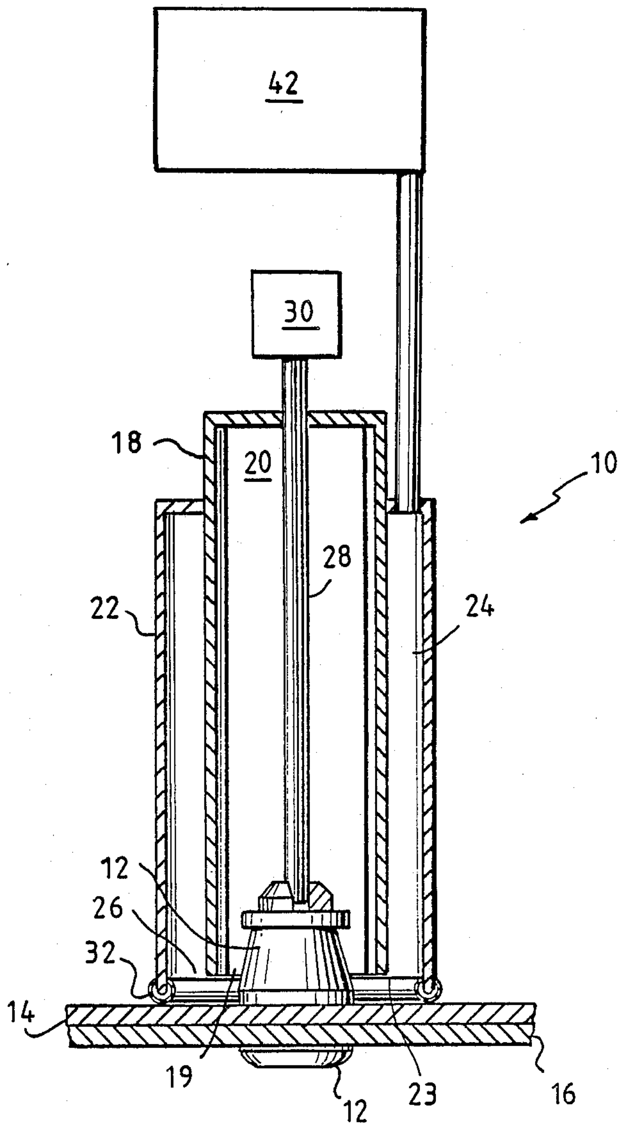
FIG. 8 is a sectional view showing a first embodiment of the secondary side of the present invention as applied to FIG. 6.

A first embodiment of the secondary side of the fastener air brush 10 is shown in FIG. 8. An accumulator (expansion tank in the figures) 42 is in fluid communication with the second chamber 24. The accumulator 42 stores the excess coating in the second chamber 24 so that the second chamber can fill with the coating 34.

Figure 9:
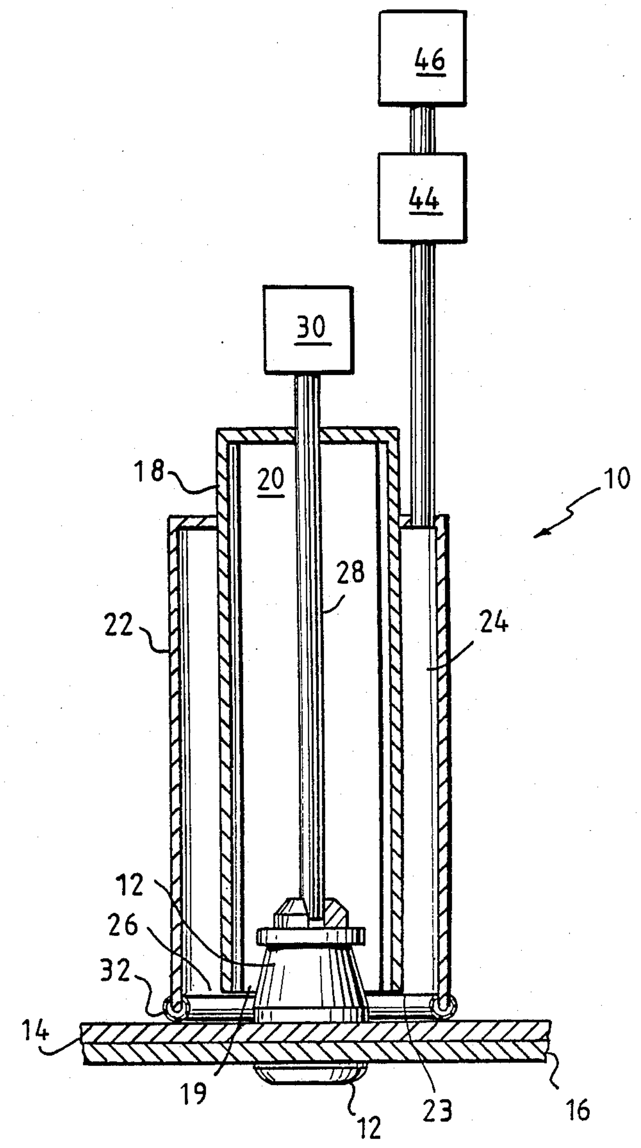
FIG. 9 is a sectional view showing a second embodiment of the secondary side of the present invention as applied to FIG. 6.

A second embodiment of the secondary side of the fastener air brush 10 is shown in FIG. 9. The accumulator 42 is replaced by regulating means 44 and valving means 46 which are also in fluid communication with the second chamber 24. The regulating means 44 and the valving means 46 both work in conjunction with each other to reduce the pressure in the second chamber 24 so that the second chamber can fill with the coating 34.

Figure 10:
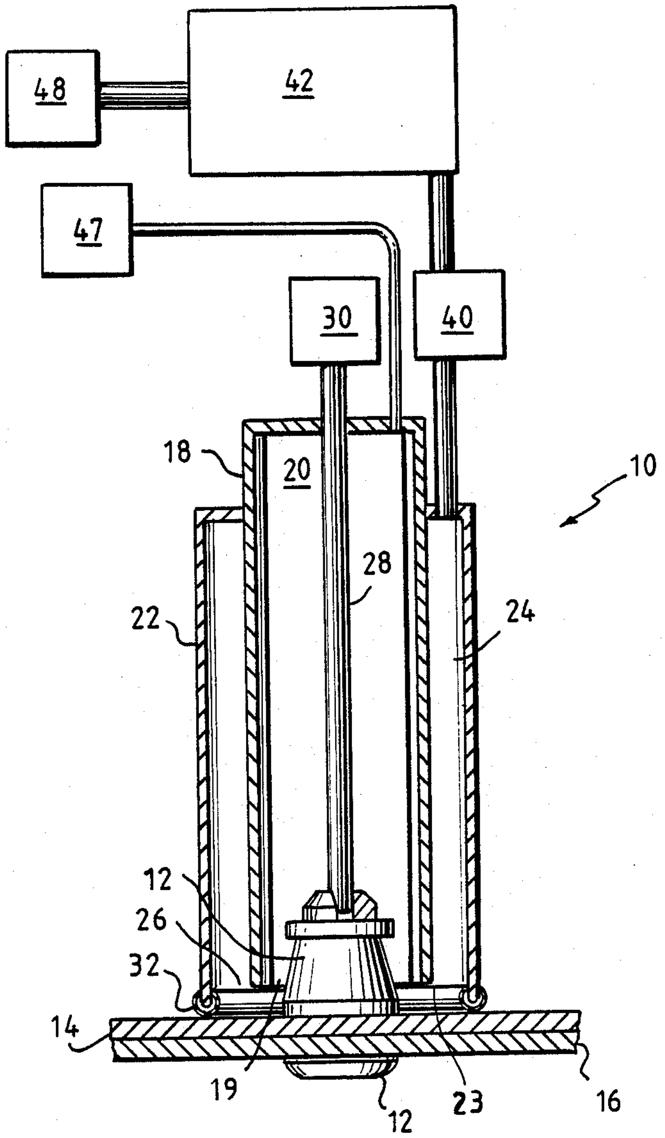
FIG. 10 is a sectional view showing a third embodiment of the secondary side of the present invention as applied to FIG. 8 wherein a pulsator is added.

A third embodiment of the secondary side is shown in FIG. 10, wherein an evacuating pump 47 and a check valve 48 are added to the accumulator 42. This allows the second chamber 24 to be vented to atmospheric pressure. A pulsator 40 is added so that the coating 34 can be accelerated and decelerated during its flow.

Figure 11:
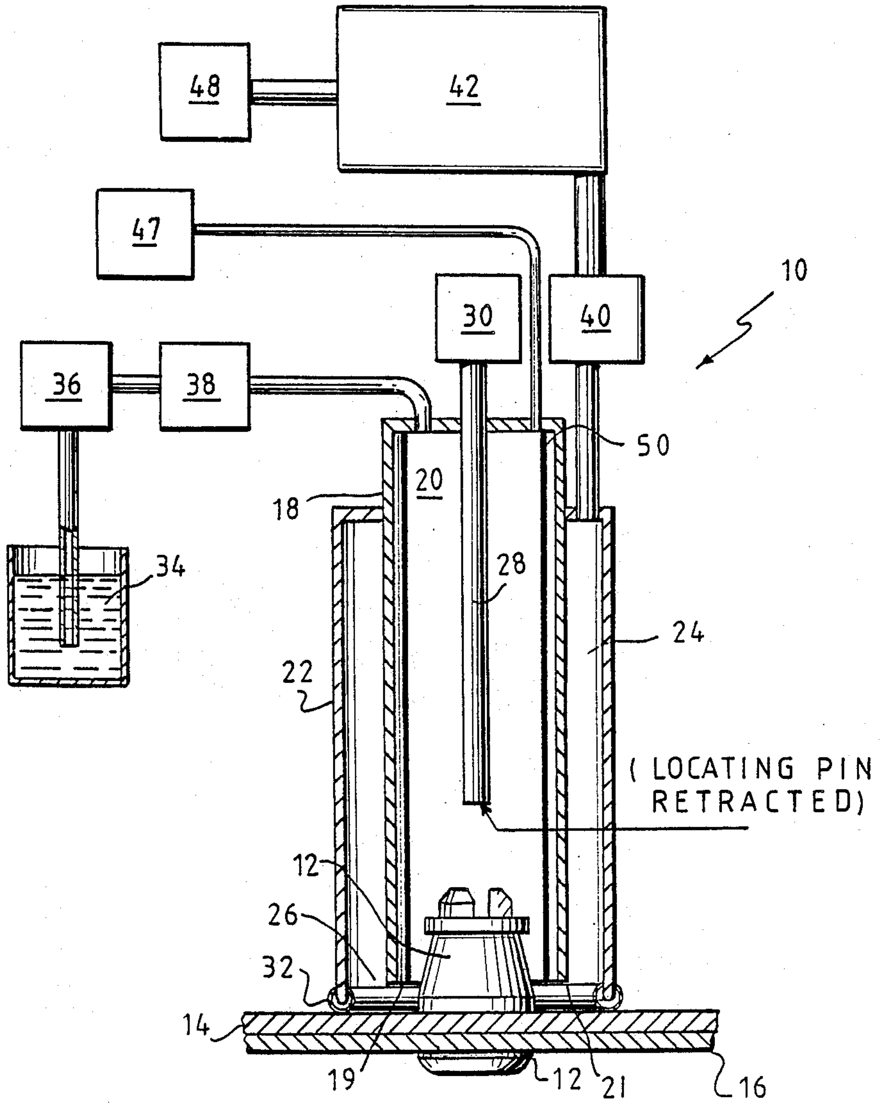
FIG. 11 is a sectional view showing the primary side and the third embodiment of the secondary side of the present invention as applied to FIG. 6.

In operation, as shown in FIG. 11, the fastener air brush 10 is placed over the fastener 12 so that the locating pin 28 mates with the fastener 12 and properly positions the fastener air brush 10. The fastener air brush 10 is held by hand pressure tightly against the work surface 14 so that the seal 32 compresses slightly and provides a mask. The locator pin 28 is then retracted to allow the location pin 28 mating surface of the fastener 12 to be coated.

The coating process includes an application cycle, a reapplication cycle, and a venting cycle.

During the application cycle, the coating 34 is atomized by the atomizer means 36 and fed under pressure, by the pressuring means 38, into the first chamber 20 where the fastener 12 is initially coated. The residual atomized coating 34 flows from the first chamber 20 through the passageway 26 and into the second chamber 24. The amount of residual atomized coating 34 that flows into the second chamber 24 is controlled by the pressurizing means 38 and the size of the accumulator 42.

The reapplication cycle begins by reducing or eliminating the pressure in the primary chamber 20 produced by the pressurizing means 38. With the decrease of pressure in the first chamber 20, the residual atomized coating 34 that filled the second chamber 24 will flow back from the second chamber 24 through the passageway 26 and into the first chamber 20. This will allow the fastener 12 to be recoated so that surfaces that were not reached during the application cycle will now be coated. This assures that the fastener 12 is completely coated.

During the venting cycle, the first chamber 20 is evacuated more completely. The evacuation pump 47 is activated, drawing atmosphere through the check valve 48. This allows air to be drawn into the accumulator 42 and the second chamber 24 which flushes the residual atomized coating 34 from the first and second chamber 20 and 24, respectively, and allows any excess coating 34 to be removed from the fastener 12.

The pulsator 40 which can be added between the accumulator 42 and the secondary chamber 20 allows the evacuation of the coating 34 to be halted and resumed in a controlled manner so as to create pressure/-vacuum pulses that would alternately accelerate and decelerate the flow of the residual coating 34 towards the fastener 12.

Figure 12:
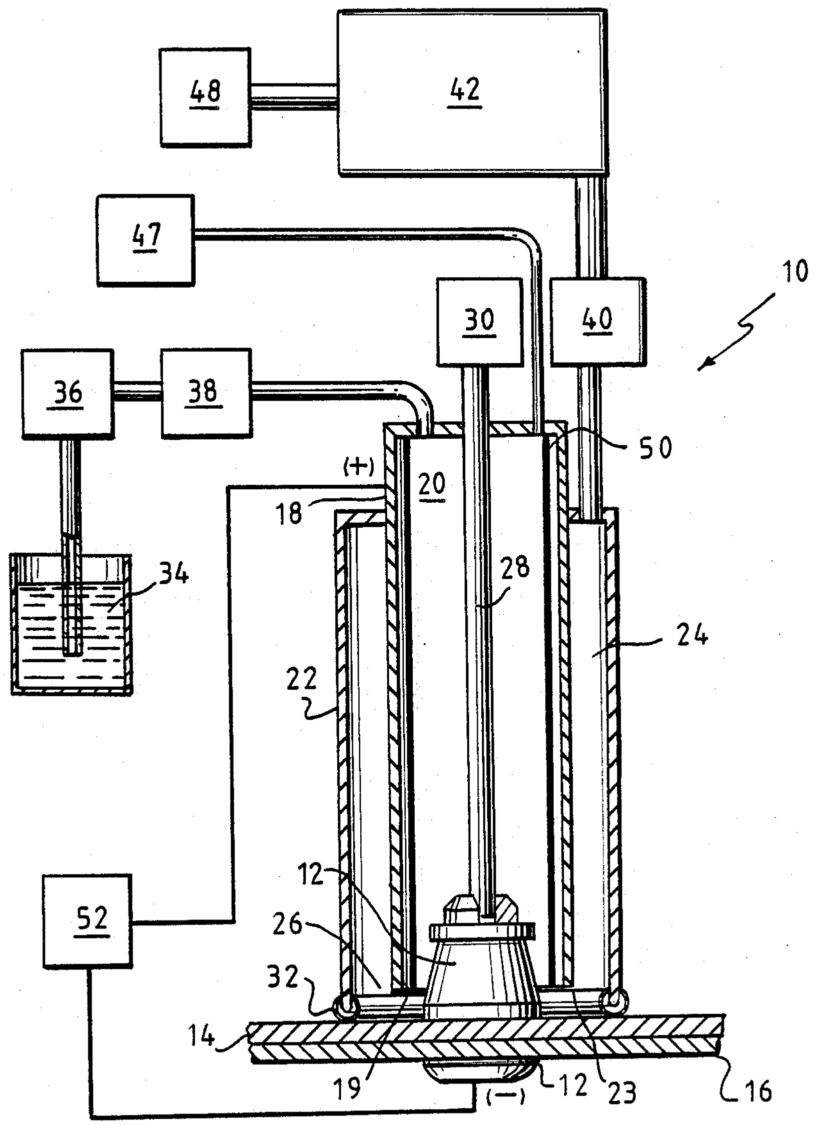
FIG. 12 is a sectional view showing the embodiment of FIG. 11 with the addition of electrostatic means.

In order to assist in the attraction of the coating 34 onto the fastener 12, electrostatic means is relied upon, as shown in FIG. 12. The first body 18 serves as a positive electrode and the fastener 12 serves as the negative electrode. An insulator 50 is placed on the internal side of the first body 18 to prevent accidental contact between the two electrodes. A power supply 52 provides the potential and can include voltage regulators and electronic sensors to help guard against arcing.

It is to be noted that the fastener air brush 10 can apply coatings to small areas and other small objects, such as, nuts, bolts, and other fasteners on flat surfaces.

The fastener air brush 10 can also be used in electronics and mechanical assemblies, for example, where small parts may have to be coated but cannot be reached by normal spraying techniques.

It will be understood that each of the elements described above, or two or more together, may also find a useful application in other types of construction and methods differing from the types described above.

The novel features which are considered characteristic for the invention are set forth in particular in the appended claims. The invention itself, however, both as to its construction and its method of operation, together with additional objects and advantages thereof, will be best understood from the following description of specific embodiments.

It will be understood that each of the elements described above, or two or more together, may also find a useful application in other types of methods and constructions differing from the types described above.

While the invention has been illustrated and described as embodied in a fastener air brush, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by letters patent is set forth in the appended claims.

I claim:

1. A handheld device for coating a fastener with a coating, said device comprising:

(a) a first body having a free end and defining a first chamber that is placeable over the fastener.

(b) means for supplying the coating under a pressure to said first chamber for coating the fastener with the coating;

(c) a second body having a free end and being disposed external to said first body forming a second chamber therebetween, said second body being rigidly attached to said first body and said free end of said second body being displaced a distance below said free end of said first body forming a passageway therebetween;

(d) means for reducing pressure in said second chamber, said reducing means drawing the coating from said first chamber where the fastener is initially coated with the coating from said supply means through said passageway and into said second chamber causing said second chamber to fill with the coating;

(e) means for attracting the coating to the fastener; and (f) evacuating means connected to said first chamber so that the coat is drawn back from said second chamber through said passageway and into said first chamber, via said evacuating means, where the fastener is recoated with the coating to assure that all areas of the fastener are coated with the coating.

2. A device as defined in claim 1, wherein said first body is a cylindrical tube with a substantially circular cross section.

3. A device as defined in claim 1, wherein said supply means include compressor means.

4. A device as defined in claim 3, wherein said supply means further include an atomizer.

5. A device as defined in claim 3, wherein said supply means is metered.

6. A device as defined in claim 3, wherein said pressure reducing means include means for pulsating said pressure so that when said pressure of said supply means is eliminated the flow of the coating will alternately accelerate and decelerate toward the fastener.

7. A device as defined in claim 1, wherein said second body is a cylindrical tube with a substantially circular cross-section.

8. A device as defined in claim 1, wherein said pressure reducing means are in fluid communication with said second chamber.

9. A device as defined in claim 1, wherein said pressure reducing means further include an accumulator.

10. A device as defined in claim 1, wherein said pressure reducing means include regulators and valves.

11. A device as defined in claim 1; further comprising means for removing excess coating from the fastener.

12. A device as defined in claim 11, wherein said removing means include means for venting said pressure reducing means and said first chamber to atmospheric pressure so that said first chamber and said second chamber are evacuated by drawing atmosphere through said pressure reducing means, said second chamber, said first chamber, and out said first chamber.

13. A device as defined in claim 12, wherein said venting means include a check valve and a vent.

14. A device as defined in claim 1; further comprising locating means for properly positioning said first body over the fastener.

15. A device as defined in claim 14, wherein said locating means are retractable.

16. A device as defined in claim 1; further comprising a seal disposed on said free end of said second body so that the coating is prevented from coating unwanted areas.

17. A device as defined in claim 16, wherein said seal is rubber.

18. A device as defined in claim 1, wherein said attracting means include electrostatic means.

19. A device as defined in claim 1, wherein said means for attracting comprises a power supply with a positive electrode connected to said first body and a negative electrode to be connected to the fastener; whereby a voltage potential can exist between said first body and the fastener.

20. A device as defined in claim 19; further comprising an insulator disposed on the internal side of said first body so that contact between said positive electrode and said negative electrode is prevented.

21. A device as defined in claim 20, wherein said power supply is voltage regulated to prevent arcing between said first body and the fastener.

22. A handheld device for coating a fastener with a coating, said device comprising:

(a) A first body having a free end and defining a first chamber that is placeable over the fastener;

(b) means for supplying the coating under a pressure to said first chamber for coating the fastener with the coating;

(c) a second body having a free end and being disposed external to said first body forming a second chamber therebetween, said second body being rigidly attached to said first body and said free end of said second body being displaced a distance below said free end of said first body forming a passageway therebetween;

(d) an accumulator for storing excess coating; and (e) evacuating means connected to said first chamber so that the coat is drawn back from said second chamber through said passageway and into said first chamber, via said evacuating means, where the fastener is recoated with the coating to assure that all areas of the fastener are coated with the coating.

* * * * *